United States Patent

Brody et al.

[15] 3,657,613

[45] Apr. 18, 1972

[54] THIN FILM ELECTRONIC COMPONENTS ON FLEXIBLE METAL SUBSTRATES

[72] Inventors: Thomas P. Brody; Derrick J. Page, both of Pittsburgh; Paul O. Raygor, Irwin, all of Pa.

[73] Assignee: Westinghouse Electric Corporation, Pittsburgh, Pa.

[22] Filed: May 4, 1970

[21] Appl. No.: 34,463

Related U.S. Application Data

[63] Continuation-in-part of Ser. No. 747,064, June 24, 1968.

[52] U.S. Cl. ....................317/235 R, 317/235 B, 317/234 S, 317/234 T, 317/234 E

[51] Int. Cl. ....................H01l 11/14

[58] Field of Search ..............317/235 B, 234 S, 234 E, 234 T

[56] References Cited

UNITED STATES PATENTS

| | | | |
|---|---|---|---|
| 3,290,569 | 12/1966 | Weimer | 317/235 |
| 3,469,017 | 9/1969 | Sturger | 174/52 |
| 3,423,649 | 1/1969 | Herlet | 317/234 |
| 3,423,821 | 1/1969 | Nishimura | 29/571 |

OTHER PUBLICATIONS

Weimer, P., Proceedings of the IRE, June 1962, " The TFT-A New Thin Film Transistor," page 1462 et. seq.

*Primary Examiner*—John W. Huckert
*Assistant Examiner*—Martin H. Edlow
*Attorney*—F. Shapoe and C. L. Menzemer

[57] ABSTRACT

This disclosure is concerned with thin film field effect transistor (FET) formed on flexible metal substrates by vapor deposition techniques. The FET is electrically insulated from the metal substrate by an electrically insulating varnish.

7 Claims, 5 Drawing Figures

THIN FILM ELECTRONIC COMPONENTS ON FLEXIBLE METAL SUBSTRATES

CROSS-REFERENCE TO RELATED APPLICATION

This application is a continuation-in-part of U.S. Pat. application Ser. No. 747,064, filed June 24, 1968.

BACKGROUND OF THE INVENTION

1. Field of The Invention

This invention is concerned with a thin film field effect transistor on a flexible metal substrate.

2. Description of The Prior Art

Thin film semiconductor devices have been made in the past by various processes, however, they have not been prepared in situ on a flexible metal (as defined hereinafter) substrate. To the contrary, prior art devices have always been made on a rigid substrate having smooth surfaces such as for example, on rigid substrates of polished glass, sapphire and quartz bodies.

The discovery has now been made that field effect transistors can be made on flexible metal substrates. The FET is electrically insulated from the substrate by a layer of an electrically insulating varnish.

SUMMARY OF THE INVENTION

In accordance with the present invention there is provided an article of manufacture comprising at least one electronic component affixed to a flexible metal substrate. The flexibility of the substrate is such that it can be wrapped about a mandrel having a diameter not exceeding 1 inch.

BRIEF DESCRIPTION OF THE DRAWINGS

The invention will become more readily apparent from the following exemplary description in connection with the accompanying drawings, in which.

DESCRIPTION OF PREFERRED EMBODIMENTS

Figure 1:
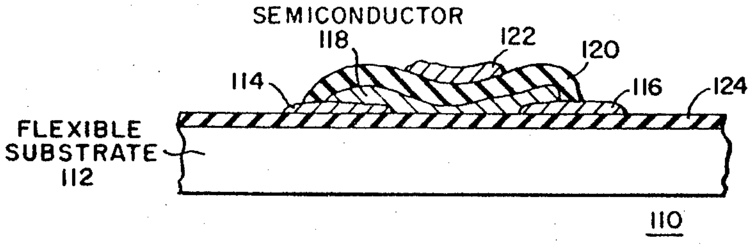
FIG. 1 is a side view, in cross-section, of a semiconductor device of this invention.

With reference to FIG. 1, there is shown a thin film field effect transistor 110 (FET) on a flexible metal substrate as an illustrative embodiment of the teachings of this invention and made in accordance with the procedures of this invention.

The transistor 110 consists of a flexible metal substrate 112, a source contact or electrode 114, a drain contact or electrode 116, a layer of semiconductor material 118, a layer of electrical insulation 120, a gate contact or electrode 122. A layer 124 of an electrically insulating varnish electrically insulates the FET from the flexible metal substrate 12.

The flexible metal substrate 112 may be comprised of a flexible tape or foil of a metal as for example nickel, aluminum, copper, tin, tantalum, silver and base alloys, mixtures and composites of any of these, and ferrous base alloys such for example as thin gauge stainless steel strip.

The term "flexible," as used in describing the substrate, means a metal that can be wrapped around a mandrel of, at the maximum, one inch in diameter and preferably a mandrel of the order of one-eighth inch in diameter. Flexible metal substrates having FET's of the type shown in FIG. 1, have been bent into radii as small as one-sixteenth inch without degradation of operating characteristics.

The layer 124 of an electrically insulating varnish serves to insulate electrically the FET from the metal substrate.

The layer 124 may consist of any suitable electrically insulating varnish examples of which include: polyester resins such as for example ethylene gylcol maleate adipatic resin, epoxy resins such as for example bisphenol epichlorohydrin resin, polyamide resins, polyimide resins such as set forth in U.S. Pat. No. 3,179,614; polyamide-imide resins such as set forth in U.S. Pat. No. 3,179,635; silicone resins, phenolaldehyde resins, polyvinyl formed phenolic resins and epoxy-polyamide-imide mixtures such as set forth in U.S. Pat. No. 3,179,630.

Varnishes of the type stated above have a surface tension such that when applied to the metal substrate they will form essentially perfect smooth flat surfaces. The smooth flat surface allows the deposition of electrode and semiconductor materials onto the surface without having to make allowance for peaks and valleys as is so common with metal oxide insulating layers.

The source 14 and drain 16 are disposed upon the insulation layer 124 of the substrate 112 and spaced apart from each other. The distance between the source and drain is not critical and depends on the properties desired. The source electrode 114 and drain electrode 116 may be of any suitable electrically conductive metal, such as a metal selected from the group consisting of gold, silver, aluminum, nickel and base alloys thereof. The source electrode 114 and drain electrode 116 should have a thickness sufficient to insure their functioning as ohmic contacts. A thickness of from 80 A to 500 A and preferably from 100 A to 300 A has been found satisfactory for most devices.

The layer of semiconductor material 118 extends between the source electrode 114 and drain electrode 116. The layer 118 of semiconductor material is in contact with and extends between the source electrode 114 and drain electrode 116. Preferably the layer 118 partially overlaps the source 114 and drain 116. The layer 118 may consist of a semiconductor material, such for example, as tellurium cadmium sulfide, cadmium selenide, silicon, indium arsenide, gallium arsenide, tin oxide and lead telluride. The layer 118 may be single crystal, polycrystalline or amorphous.

The thickness of the semiconductor layer 118 may vary from an average thickness of 40 A for tellurium to several thousand angstroms for the wider band gap materials such as cadmium sulfide and cadmium selenide.

The insulation layer 120 does not have to completely cover layer 118 of semiconductor material and extend from the source electrode 114 to the drain electrode 116, it need only insulate the gate electrode 122 from the semiconductor layer 118.

The insulation layer 120 may be comprised of a suitable electrical insulating material selected from the group consisting of inorganic insulators such as silicon monoxide, silicon dioxide, aluminum oxide, calcium fluoride, magnesium fluoride and polymerizable organics such as polymers of hexachlorobutadiene, divinyl benzene, aryl sulfones, fluorinated alkenyls (e.g. polytetrafluoroethylene) and para-xylene.

The insulation layer 120 should be as thin as possible so that modulation can be produced in the device current at a relatively low voltage. However, the layer must serve as an adequate electrical insulator. A layer of 100 A has occasionally been found to contain pin holes which adversely affect the electrical insulation function of the layer. A thickness of about 300 A appears to be the minimum thickness which will ensure that there are no pin holes while 1,000 A appears to be optimum between a void free insulation layer and low voltage modulation. As the operating voltage of the device increases to 100 volts, a thickness of about 3,000 A is desirable and at an operating voltage of 200 volts a thickness of about 500 A to 6,000 A is desirable.

The gate electrode 122 is disposed on the insulation layer 20 between the source electrode 14 and the drain electrode 16.

The gate electrode 122 consists of a good electrically conductive metal such as a metal selected from the group consisting of aluminum, copper, tin, silver, gold and platinum. In order to ensure that the gate electrode 122 provides a high conductivity, it should have a thickness of about 300 A to 1,000 A and preferably from 500 to 1,000 A.

Field effect transistors of the type shown in FIG. 1 have stable operating characteristics and can be worked at frequencies up to 60 MHz. Such transistors can be operated for over 1,000 hours without any substantial measurable change of characteristics.

The device of this invention can be used for any application that does not require high power, very high frequency or high temperature. The devices have been used in cascade amplifiers, down-converter and oscillator circuits.

Devices of the type shown in FIG. 1 have been found to have the following performance characteristics:

Transconductance — About 6,000 micro-mhos at 4 ma drain current.

Operating Temperature — Up to 150° C. ambient.

Maximum Source-Drain Voltage — Over 200 volts.

The device 110 of FIG. 1 has been prepared by vacuum evaporation through metal stencils.

Broadly, the flexible metal substrate with insulating layer 124 thereon is disposed in a vacuum chamber, then a metal, for example gold or one of the other metals designated above, is evaporated through the stencil to form the source and drain electrodes. A second stencil is then substituted and semiconductor material, such as tellurium or one of the other semiconductor materials listed above, is evaporated to form the semiconductor region which extends between the source and drain electrodes. The stencil is again changed and an electrical insulation layer, as for example, a layer of silicon monoxide, is evaporated to form the gate insulator. Finally, through a fourth stencil the gate contact, of aluminum or other suitable metal, is evaporated onto the insulation layer.

More specifically, the material for the flexible metal substrate is selected and cut to size and shape. The versatility of the technique of this invention allows one to select a substrate of any size and shape desired. One preferred form is to employ a roll of substrate material with sprocket teeth disposed uniformly along its edge like photographic film.

The metal substrate with a cured resin or varnish coating on its surface, is first washed in methanol or any other suitable organic solvent dried with dry nitrogen, and baked in an oven for approximately 30 minutes at about 100° C.

The substrate is then cleaned-off with dry nitrogen after removal from the oven.

Figure 3:
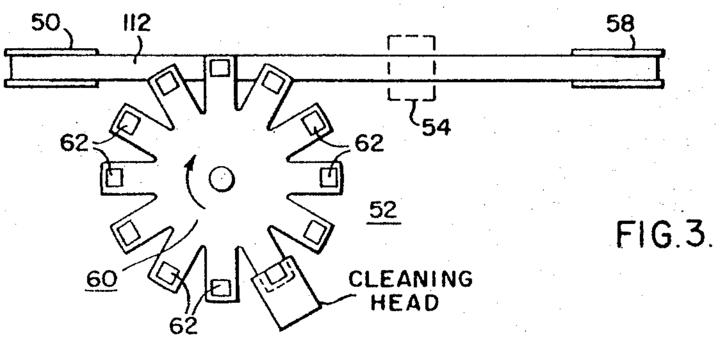
FIG. 3 is a top view of the apparatus of FIG. 2.
Figure 4:
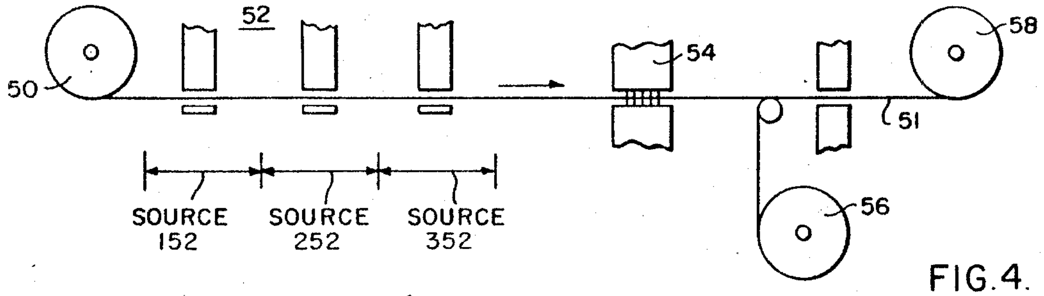
FIG. 4 is a side view of apparatus employed in practicing the teachings of this invention.

With reference to FIGS. 3 and 4, the cleaned flexible metal substrate is then wound onto a feed reel 50, or other supply feed source, and disposed in a vacuum chamber.

By employing a leader 51 which may consist of a portion of the substrate itself on any other suitable material, such for example as a cellulose compound tape, the flexible metal substrate 112 with electrically insulating layer 124 thereon is disposed between components of a deposition station 52, a test station 54, a sealing component station 56 and a take-up reel 58.

The vacuum chamber is then pumped down to a pressure of less than $10^{-5}$ torr and preferably less than $10^{-7}$ torr.

The flexible metal substrate 112 is then moved to bring into position an initial portion at the deposition station 52.

The deposition station 52 is comprised of a mechanical mask changing mechanism 60 upon which are positioned a series of masks 62, a thickness monitor 64, as for example, a micro-balance, an optical monitor or a resistance monitor system and a mechanical shutter mechanism 66 which is employed to control the starting and stopping of the deposition.

As the first portion of the flexible substrate is positioned at the deposition station, the source and drain electrode mask is disposed over the substrate 112 and the source electrode 114 and drain electrode 116 (FIG. 1) are vapor deposited on the electrically insulating layer 124 on the metal substrate 112. The source electrode 114 and drain electrode 116 may consist of any metal selected from the group consisting of gold, silver, aluminum and nickel.

Satisfactory devices have been made with a source and drain having a thickness of from about 100 A to 500 A formed by depositing the metal on the substrate at a rate of about 0.1 A to 50 A, and preferably from about 0.7 A to 6 A per second. Very good devices have been made in which both the source and drain are gold having a thickness of from 100 A to 300 A formed by depositing the gold on the substrate at a rate of from 0.7 A to 6 A per second.

After the deposition of a sufficient thickness of the source and drain electrodes has been indicated by the monitoring system 64, a mechanical shutter mechanism 66 is activated to shut-off the metal vapor.

The mask changing mechanism 60 is then activated to index the next mask over the substrate and the layer 18 of semiconductor material is vapor deposited between the source and drain electrodes.

The layer 118 of semiconductor material may consist of a semiconductor material such for example as tellurium, cadmium sulfide, silicon, cadmium selenide, indium arsenide, gallium arsenide, tin oxide and lead telluride.

Satisfactory devices have been made in which the layer of semiconductor material has a thickness of from 40 A to 200 A and preferably about 100 A when the semiconductor material is tellurium, up to about 5,000 A for the wider band-gap materials as cadmium sulfide and cadmium selenide.

After completion of the deposition of the layer 118, the next mask is indexed into position and layer 120 of electrical insulation material is vapor deposited over the layer 18 of semiconductor material.

As previously mentioned, the layer 120 consists of an electrical insulating material for example, silicon monoxide, silicon dioxide, calcium fluoride, magnesium fluoride, polymerized hexachlorobutadiene, polydivinyl benzene, poly-para-xylene, and polytetrafluoroethylene, and also may comprise electrical insulating glass such as lead silicates, lead borates, lead borosilicates, and mixtures thereof. As discussed hereinabove, the thickness of the layer 120 is dependent on the operating voltage of the device with a thickness of about 300 A to 500 A being a satisfactory minimum. Satisfactory devices have been made employing a silicon monoxide layer having a thickness of 300 A to 500 A, the layer having been deposited at a rate of 0.1 to 5 A per second and preferably at a rate of 0.2 A to 2.0 A per second.

The next mask is then indexed into position and the gate electrode 122 is vapor deposited onto layer 20.

The gate electrode or contact 122 consists of an electrically conductive metal selected from the group consisting of aluminum, copper, tin, silver, gold and platinum.

The gate electrode or contact should have a thickness of from about 300 A to 1,000 A and preferably from 500 A to 1,000 A and for best results should be vapor deposited at a rate of from 3 A to 50 A per second and preferably from about 6 A to 20 A per second.

If desired still another mask may then be indexed into position and the device sealed within a silicon monoxide or similar coating to protect it from the ambient. A coating of silicon monoxide from about 250 A to 1,000 A has proven satisfactory when deposited at a rate of about 1 A to 3 A per second.

After the completion of the device, the substrate is advanced and the sequence repeated whereby a plurality of devices are formed one after another on the substrate.

It will be noted that the mechanical mask changing mechanism 60 contains more than the required four or five masks 62. The mechanism 60 in FIG. 4 contains twelve masks or three sets of the required four masks. As the mechanism 60 is rotated, each mask 62 is passed under a cleaning head 63 where it is cleaned before reuse.

As the subsequent devices are prepared, the previously formed devices advance to the testing component 54 where their electrical characteristics are checked.

After being found to have satisfactory electrical characteristics, the device advances to the sealing component where it is sealed between a cellulose composition tape and the substrate, thus hermetically sealing the device and hence to the take-up reel 58 for storage.

Figure 2:
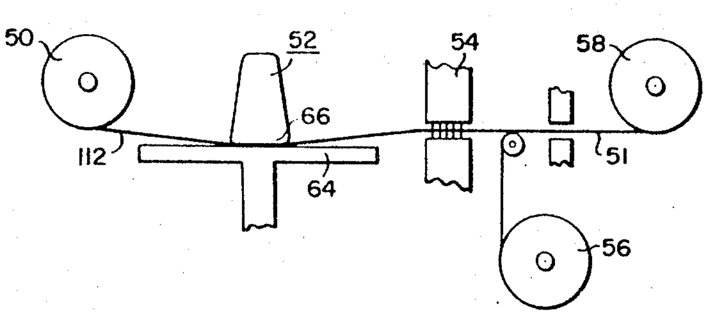
FIG. 2 is a side view of apparatus employed in practicing the teachings of this invention.
Figure 5:
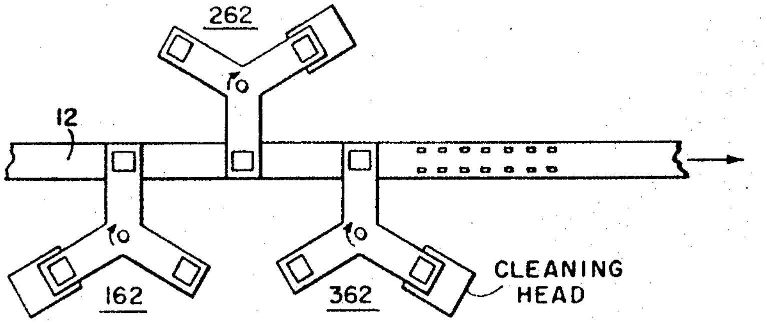
FIG. 5 is a top view of the apparatus of FIG. 4.

With reference to FIGS. 5 and 6 if desired, the deposition station 52 of FIGS. 2 and 3 may be divided into separate stations, and rather than indexing the various masks and vapor deposition sources over or under the substrate, the substrate is moved sequentially past, under or over the masks 162, 262, 362 and the vapor deposition material sources 152, 252, 352. There may be a separate mask station and vapor deposition material source station for each vapor deposition or two or more depositions may be carried out at the same station.

It should be understood of course that the mask or masks and the vapor deposition source or sources may be positioned above or below the flexible substrate as it passes through the vacuum chamber.

Certain of the semiconductor materials which may be used in practicing the teachings of this invention can only be deposited onto a heated metal substrate.

For example, cadmium sulfide must be deposited on a substrate having a temperature of from 150° to 200° C. This does not present any major problem in the selection of a substrate since all metals and insulating layer 124 will withstand such a temperature for the time period necessary for depositing the layer of semiconductor material.

Indium arsenide and gallium arsenide require a substrate temperature of about 500° C. during the vapor deposition of the semiconductor layer. When employing such semiconductor materials one must select a substrate and insulating layer material capable of withstanding such temperatures.

When employing semiconductor materials requiring a heated substrate, the apparatus shown in FIGS. 4 and 5 is preferred over the apparatus shown in FIGS. 2 and 3.

We claim as our invention:

1. A semiconductor device comprising: (1) a flexible metal substrate such that it can be wrapped around a mandrel, (2) a first layer of an electrically insulating varnish disposed on at least one major surface of the substrate, (3) a first electrode, (4) a second electrode, said first and second electrodes both being disposed on the same surface of the layer of electrically insulating varnish and spaced apart from each other, (5) a layer of semiconductor material, said layer of semiconductor material being in contact with and extending between said first and second electrodes, (6) a layer of an electrically insulating material disposed on the layer of semiconductor material, and (7) a third electrode, serving as the gate electrode disposed on said layer of electrically insulating material.

2. The device of claim 1 in which:

1. the flexible substrate is aluminum.

3. The device of claim 2 in which the layer of semiconductor material consists of tellurium.

4. The device of claim 1 in which the flexibility of the substrate is such that it can be wrapped around a mandrel having a diameter of 1 inch.

5. The device of claim 1 in which:

1. the substrate consists of a flexible metallic film having a layer of an electrically insulating varnish disposed on one surface thereof;
2. the first and second electrode consists of a metal selected from the group consisting of gold, silver, aluminum, nickel and base alloys thereof;
3. the layer of semiconductor material consists of a semiconductor material selected from the group consisting of tellurium, cadmium, sulfide, cadmium selenide, indium arsenide, gallium arsenide, tin oxide and lead telluride;
4. the layer of electrically insulating material consists of a material selected from the group consisting of organic and inorganic electrically insulating material having a dielectric strength of 1,000 volts per mil; and
5. the third electrode consists of a metal selected from the group consisting of aluminum, copper, tin, silver, gold and platinum.

6. The device of claim 5 in which:

1. the first and second electrodes have a thickness ranging from 100 A to 500 A;
2. the layer of semiconductor material has a thickness ranging from 40 A to 5,000 A;
3. the layer of electrically insulating material has a thickness ranging from 100 A to 6,000 A; and
4. the third electrode has a thickness ranging from 300 A to 1,000 A.

7. The device of claim 5 in which:

1. the first and second electrodes have a thickness ranging from 100 A to 300 A;
2. the layer of electrically insulating material has a thickness ranging from 300 A to 1,000 A; and
3. the third electrode has a thickness ranging from 500 A to 1,000 A.

* * * * *